(12) United States Patent
Coolbaugh et al.

(10) Patent No.: US 8,015,538 B2
(45) Date of Patent: Sep. 6, 2011

(54) DESIGN STRUCTURE WITH A DEEP SUB-COLLECTOR, A REACH-THROUGH STRUCTURE AND TRENCH ISOLATION

(75) Inventors: Douglas D Coolbaugh, Highland, NY (US); Xuefeng Liu, South Burlington, VT (US); Robert M. Rassel, Colchester, VT (US); David C. Sheridan, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 657 days.

(21) Appl. No.: 11/941,104

(22) Filed: Nov. 16, 2007

(65) Prior Publication Data
US 2008/0092094 A1    Apr. 17, 2008

Related U.S. Application Data

(63) Continuation-in-part of application No. 11/548,310, filed on Oct. 11, 2006, now abandoned.

(51) Int. Cl.
| | |
|---|---|
| G06F 17/50 | (2006.01) |
| G06F 11/22 | (2006.01) |
| G06F 9/455 | (2006.01) |
| H01L 29/00 | (2006.01) |
| H01L 21/8238 | (2006.01) |
| H01L 21/20 | (2006.01) |

(52) U.S. Cl. ........ 716/136; 716/100; 716/106; 257/133; 257/511; 257/480; 438/379; 438/189

(58) Field of Classification Search .................. 716/1, 5, 716/100, 106, 136; 438/199, 379; 257/133, 257/379, 511
See application file for complete search history.

(56) References Cited

U.S. PATENT DOCUMENTS

| | | |
|---|---|---|
| 3,573,573 A | 4/1971 | Moore |
| 4,214,315 A | 7/1980 | Anantha et al. |
| 4,242,791 A | 1/1981 | Horng et al. |
| 4,392,149 A | 7/1983 | Horng et al. |
| 4,644,383 A | 2/1987 | Akcasu |
| 4,771,328 A | 9/1988 | Malaviya et al. |
| 4,887,144 A | 12/1989 | Cook et al. |
| 4,951,115 A * | 8/1990 | Harame et al. ............. 257/191 |
| 6,352,901 B1 | 3/2002 | Chang |

(Continued)

OTHER PUBLICATIONS

U.S. Appl. No. 11/548,310 Non-Final Rejection dated Feb. 11, 2009.

(Continued)

*Primary Examiner* — Stacy A Whitmore
*Assistant Examiner* — Magid Y Dimyan
(74) *Attorney, Agent, or Firm* — Anthony J. Canale; Roberts Mlotkowski Safran & Cole, P.C.

(57) ABSTRACT

The invention relates to noise isolation in semiconductor devices, and a design structure on which a subject circuit resides. A design structure is embodied in a machine readable medium used in a design process. The design structure includes a deep sub-collector located in a first epitaxial layer, and a doped region located in a second epitaxial layer, which is above the first epitaxial layer. The design structure further includes a reach-through structure penetrating from a surface of the device through the first and second epitaxial layers to the deep sub-collector, and a trench isolation structure penetrating from a surface of the device and surrounding the doped region.

20 Claims, 17 Drawing Sheets

U.S. PATENT DOCUMENTS

| | | | | |
|---|---|---|---|---|
| 6,455,902 | B1* | 9/2002 | Voldman | 257/378 |
| 6,956,266 | B1 | 10/2005 | Voldman et al. | |
| 7,076,749 | B2* | 7/2006 | Kemerer et al. | 716/4 |
| 7,329,940 | B2* | 2/2008 | Coolbaugh et al. | 257/565 |
| 2002/0084506 | A1 | 7/2002 | Voldman et al. | |
| 2003/0094673 | A1 | 5/2003 | Dunn et al. | |
| 2004/0195655 | A1 | 10/2004 | Ohnishi et al. | |
| 2005/0250289 | A1 | 11/2005 | Babcock et al. | |
| 2006/0071292 | A1 | 4/2006 | Coolbaugh et al. | |
| 2007/0096257 | A1* | 5/2007 | Coolbaugh et al. | 257/565 |
| 2007/0287243 | A1* | 12/2007 | Liu et al. | 438/199 |
| 2008/0036029 | A1* | 2/2008 | Liu et al. | 257/510 |
| 2008/0038937 | A1* | 2/2008 | Chen et al. | 438/791 |

OTHER PUBLICATIONS

U.S. Appl. No. 11/548,310 Notice of Allowance dated May 5, 2009.

* cited by examiner

DESIGN STRUCTURE WITH A DEEP SUB-COLLECTOR, A REACH-THROUGH STRUCTURE AND TRENCH ISOLATION

CROSS-REFERENCE TO RELATED APPLICATIONS

The present application is a continuation in part of U.S. application Ser. No. 11/548,310 filed on Oct. 11, 2006 now abandoned, the disclosure of which is expressly incorporated by reference herein in its entirety.

DESCRIPTION

1. Field of the Invention

The invention relates generally to semiconductor devices, and more specifically, to noise isolation in semiconductor devices. The invention further relates to a design structure on which a subject circuit resides.

2. Background of the Invention

Semiconductor devices may comprise derivatives such as, for example, PIN diodes, Schottky barrier diodes, shallow trench isolation (STI) diodes, polysilicon MOSFET (metal oxide semiconductor field effect transistors) gate defined PN diode structures (also known as polysilicon bound diodes), and hyper-abrupt (HA) varactor diodes. A goal of these structures is to achieve very high speeds, for example, on the order of 50 to 200 GHz applications using 300 GHz transistors. In order to achieve these speeds, though, and particularly for radio frequency (RF) applications such as, for example, millimeter wave (mmW) applications, space applications, and other advanced technologies, the ability to isolate a transistor and its derivatives from noise is key.

With the objective of very high speeds, in Schottky and PIN diodes, the significant metrics are low leakage, a cutoff frequency greater that 500 GHz, and optimizing the trade-off between low insertion loss and high noise isolation. Towards this end, the frequency will be optimized by reducing the lateral resistance of the device, minimizing the cathode-to-anode spacing, and lowering the resistance of the sub-collector. Additionally, the frequency will be further optimized by increasing the distance to the sub-collector. In an HA varactor diode, the principal metrics are tunability, and a quality factor (also known as Q-factor) greater than 10 at an application frequency of 70 GHz.

In any of these structures, in order to further improve the frequency, certain isolation structures may be included. For example, deep trench (DT) isolation structures sometimes surround a structure in order to reduce the outside side wall capacitance. Alternately, in lower-cost applications such as, for example, wireless, a trench isolation structure may isolate a region above the sub-collector to prevent diffusion from the reach-through and to reduce parasitics on the side wall, creating a vertical current and reducing resistance.

Additionally, in combination with either DT or trench isolation, shallow trench isolation (STI) structures are frequently used to separate diffusions on the surface of the device. Such isolation structures, though, even in combination with the other known techniques discussed above, have not isolated structures from noise sufficiently to achieve the desired very high speeds. Accordingly, a need has developed in the art for structures that will provide noise isolation in RF or similar applications.

SUMMARY OF THE INVENTION

In a first aspect of the invention, a structure comprises a deep sub-collector located in a first epitaxial layer and a doped region located in a second epitaxial layer, which is above the first epitaxial layer. The device further comprises a reach-through structure penetrating from a surface of the device through the first and second epitaxial layers to the deep sub-collector, and a trench isolation structure penetrating from a surface of the device and surrounding the doped region.

In a second aspect of the invention, a multi-circuit structure comprises first and second epitaxial layers and a shallow trench isolation structure in the second epitaxial layer isolating diffusion elements on the surface. The structure further comprises a trench isolation structure in the first and second epitaxial layers isolating a central region from a reach-through structure.

In a third aspect of the invention, a method of forming a structure comprises forming a first epitaxial layer on a substrate, forming a first sub-collector in the first epitaxial layer, and forming a second epitaxial layer on the first epitaxial layer. The method further comprises forming a device over the first sub-collector, forming a reach-through in the first and second epitaxial layers which is electrically connected to the first sub-collector, and forming a trench isolation structure in order to electrically isolate the device from the reach-through.

In a fourth aspect of the invention, a method comprises creating a heavily doped deep sub-collector in a substrate, depositing a first epitaxial layer over the substrate and deep sub-collector, and creating a deep reach-through in the first epitaxial layer, the deep reach-through being in contact with the deep sub-collector. The method further comprises depositing a second epitaxial layer over the first epitaxial layer and deep reach-through, creating a near reach-through in the second epitaxial layer, the near reach-through being in contact with the deep reach-through, and forming a trench isolation structure within the perimeter of and in order to isolate the deep and near reach-throughs.

In another aspect of the invention, there is a design structure embodied in a machine readable medium used in a design process, the design structure comprising a deep sub-collector located in a first epitaxial layer, and a doped region located in a second epitaxial layer, which is above the first epitaxial layer. The design structure further comprises a reach-through structure penetrating from a surface of the device through the first and second epitaxial layers to the deep sub-collector, and a trench isolation structure penetrating from a surface of the device and surrounding the doped region.

In embodiments, the design structure comprises a netlist, which describes the circuit. In further embodiments, the design structure resides on storage medium as a data format used for the exchange of layout data of integrated circuits. In even further embodiments, the design structure includes at least one of test data files, characterization data, verification data, or design specifications.

In yet another aspect of the invention, there is a design structure embodied in a machine readable medium for designing, manufacturing, or testing a design, the design structure comprising first and second epitaxial layers, and a shallow trench isolation structure in the second epitaxial layer isolating diffusion elements on the surface. The design structure further comprises a trench isolation structure in the first and second epitaxial layers isolating a central region from a reach-through structure.

BRIEF DESCRIPTION OF DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

Figure 1:
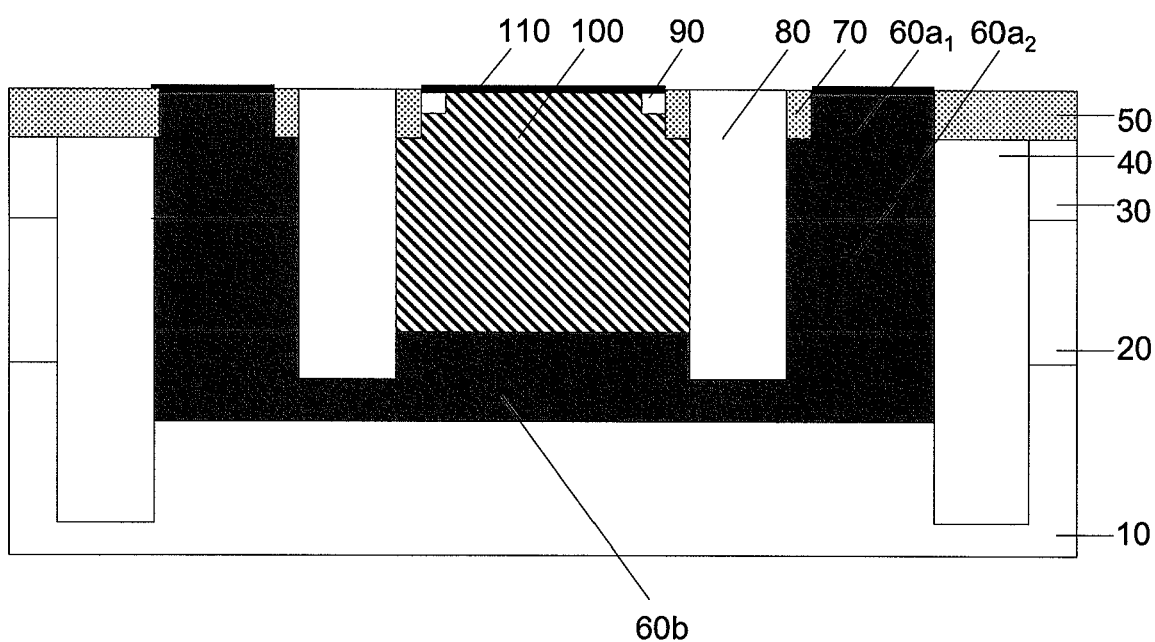
FIGS. 1-16 show alternative structures in accordance with the invention.

The invention relates to a semiconductor structure and a method of manufacturing. In embodiments, the invention more specifically relates to a method of manufacture forming a double epitaxy structure with multiple trench isolation structures. In embodiments, the processing steps implemented by the invention produce a region comprising a reach-through and a deep sub-collector, which has low resistance and low capacitance. The invention may be suitable for CMOS, RF CMOS, BiCMOS, RF BiCMOS, RF BiCMOS Silicon Germanium (SiGe), RF BiCMOS Silicon Germanium Carbon (SiGeC), bipolar SOI, homo-junction, and hetero-junction bipolar transistor (HBT) devices, to name a few. (U.S. application Ser. No. 11/163,882 is herein incorporated by reference in its entirety.)

In the discussion that follows, like reference numerals are used to refer to similar elements, such that a detailed discussion of each like element is not repeated for each embodiment. Additionally, it should be understood that the figures are not necessarily drawn to scale. Further, as will be understood by one of skill in the art, in alternative embodiments, although shown in the figures in only two dimensions, elements of the present invention may be configured in three-dimensional rings or rectangles around a vertical center line drawn through each figure. That is, in alternative embodiments, all elements, some elements, or no elements may be configured in three-dimensions.

Referring to FIG. 1, a double-epitaxy multi trench isolation Schottky barrier diode device is shown in cross-section according to one embodiment of the invention. The structure shown in FIG. 1 comprises a substrate 10, a first epitaxial (epi) layer 20, and a second epi layer 30. A deep trench (DT) isolation structure 40 penetrates from the surface of the device through the second and first epi layers 30 and 20 and into the substrate 10. A first STI 50 surrounds the surface of the DT 40. A reach-through structure generally denoted as 60a (which may comprise stacked near and deep reach-throughs $60a_1$ and $60a_2$) extends to a deep sub-collector (DS) 60b. The reach-through structure 60a abuts the inside of the DT 40, while the DS 60b extends between the bottom of the sides of the DT 40. A second STI 70 rings the inside of the surface of the reach-through structure 60a, and a trench isolation (TI) structure 80 penetrates through the second STI 70 down to the DS 60b. A P+ diffusion region 90 (in this embodiment, in the shape of a guard ring) lines the inside edge of the second STI 70. In embodiments, the P+ diffusion region 90 will act as an anode.

A doped region 100 lies in the region bounded by the second STI 70, the TI 80, and the P+ guard ring 90 to the sides, and by the DS 60b below. In this embodiment, the doped region 100 comprises a low-doped N− region. A salicide 110 is formed on the surface of the structure, above the doped region 100, the P+ guard ring 90, and a portion of the reach-through 60a. The details of each of these elements will be discussed in turn below.

The structure shown in FIG. 1 may be fabricated by the following method. In embodiments, the substrate may be silicon or germanium, although other materials and/or substrates may be equally used such as, for example, SOI. Although not shown in FIG. 1, in the process of forming the structure shown in FIG. 1, in order to form the DS 60b, a pad oxide may be formed over the substrate 10. A photo-resist layer is formed over the pad oxide, and exposed in order to open a window to the substrate 10. The window is formed in a well known semiconductor photo-resist process, such as using spin on glass techniques. As such, a description of the photo-resist process is not necessary for a person of skill in the art to practice this particular step. After the window is opened in the photo-resist, the method of fabrication continues by doping, e.g. ion implanting, the exposed substrate 10 with well known dopants to form a DS 60b. The DS 60b is, for example, a collector that is formed relatively further away from the top surface of the structure. In one illustrative embodiment, the dopant element for a sub-collector may include, for example, Arsenic (As), Antimony (Sb), Phosporous (P), or other N-doped element. In one implementation, doping occurs at a common energy level and dosage, well known to those of skill in the art (e.g., in the energy range of approximately 20-60 KeV and a dose of $10^{14}$ to $10^{16}$ atoms/cm$^2$). The doping concentration of the DS 60b is high, for example, $1 \times 10^{18}$ to $1 \times 10^{21}$ atoms/cm$^3$. The ion implantation process forms the DS 60b, e.g., deep N+ region, extending into the substrate 10. In embodiments, the sheet resistance of the DS 60b may range from approximately 1 to 100 ohms/square.

After formation of the DS 60b, the photo-resist layer is stripped using conventional processes. In this processing step, the pad oxide may also be stripped, e.g., etched, using conventional processes. In embodiments, the stripping process removes any implant damage that occurred during the doping process described above.

The first epi layer 20 is formed over the substrate 10 and the DS 60b. In embodiments, the DS 60b grows up into the first epi layer 20. The first epi layer 20 may range in thickness from approximately 0.25 to 5 μm.

In order to form the deep reach-through, although not shown in FIG. 1, a second pad oxide may be formed over the first epi layer 20. A second photo-resist layer is formed over the pad oxide, and exposed in order to open a window to the first epi layer 20. The window is formed in a well known semiconductor photo-resist process, such as using spin on glass techniques. After the window is opened in the photo-resist, the method of fabrication continues by doping, e.g., ion implanting, the exposed first epi layer 20 with well known dopants to form a deep reach-through. The deep reach-through is formed by implanting dopants such as, for example, Arsenic (As), Antimony (Sb), Phosporous (P), or other N-doped element. The deep reach-through functions as a conducting path or low resistance electrical and thermal resistance connection to the DS 60b.

The second photo-resist layer and pad oxide may then be stripped using conventional processes. As above, any damage from the ion implantation process may be repaired during this stripping process.

In accordance with a dual epi process of the invention, a second epi layer 30 is formed over the first epi layer 20 and deep reach-through, forming stacked epi layers. The second epi layer 30 may be fabricated to have a wide thickness flexibility to provide tunability of the device. In embodiments, the second epi layer 30 is approximately in the range of 0.25 to 5 μm, which may be in the same range as the thickness of the first epi layer 20. In embodiments, the second epi layer 30 effectively increases the distance between the DS 60b and the surface of the structure.

The DT structure 40 is formed by conventional processes. The height of the DT 40 will depend upon the thickness of the first and second epi layers 20 and 30, and may range from 5 to 10 μm, or even to approximately 12 μm, but preferably extends below the bottom of the DS 60*b*. It should be understood that the DT 40 may include a dielectric side wall material and a fill material in the dielectric, e.g., polysilicon, Phosphosilicate Glass (PSG), or Boro-Phosphosilicate Glass (BPSG). The DT 40 may be constructed either before or after the STI structures 50 and 70. The first and second STI structures 50 and 70 also formed by conventional processes.

The reach-through structure 60*a* may comprise a near and a deep reach-through. The near reach-through is formed in the second epi layer 30, stacked upon the deep reach-through, by conventional processes. In combination, the near reach-through, deep reach-through, and DS 60*b* form a wrap around cathode reach-through structure.

The TI 80 is formed inside the stacked near and deep reach-throughs, by conventional processes. As with the DT 40, the depth of the TI 80 will depend upon the first and second epi layers 20 and 30, and may have a minimum depth of approximately 0.6 μm, but should not extend as far as the bottom of the DS. The TI 80 may be filled with polysilicon. The TI 80 may be constructed at the same time as the DT 40, in which case it might also be constructed of the same materials as the DT 40. Alternately, the TI 80 may be constructed after the STI structures, in which case it may be filled with the same material as that used in the back end of the line, such as, for example, PSG, or BPSG. The TI 80 reduces the parasitics from the reach-through structure. Effectively, the combination of the DT 40 and the TI 80 surrounding the stacked reach-through structure, wherein TI 80 does not penetrate as deeply as DTI 40, produce a low-resistance parasitic reach-through.

In order to form the Schottky barrier diode, the doped region 100 is formed in the central region, between the TI 80 and above the DS 60*b*, by conventional methods. The P+ guard ring 90 is implanted at the top of the doped region 100, lining the inside of the second STI 70, again by conventional methods. The P+ guard ring 90 reduces the side wall leakage. The salicide 110, which may comprise a refractory metal such as, for example, Tungsten, Cobalt, Titanium, or Tantalum, is formed on the surface of the device, above the doped region 100 and the P+ guard ring 90, by conventional methods. This salicide electrically shorts the Schottky junction above the doped region 100 to the P+ guard ring 90. Additionally, the salicide 110 is also formed on the surface of the device above the stacked reach-through structure, by conventional methods, in order to form a highly ohmic/low resistance contact.

By the method of the present invention, a low-resistance and low-capacitance path connects the sub-collector 60*b* and the reach-through structure 60*a*. This path is isolated from the outside by the DT 40, and from the inside by the TI 80. Additionally, by the dual-epitaxial method described herein, the DS 60*b* is distanced substantially further from the surface of the structure.

As will be understood by one of skill in the art, in alternative embodiments, although shown in the figures in only two dimensions, the steps of the method described above, and likewise the elements of the devices shown in FIGS. 1-16, may be configured in three-dimensional rings or rectangles around a vertical center line drawn through each figure. That is, in alternative embodiments, all elements, some elements, or no elements may be configured in three-dimensions.

Figure 2:
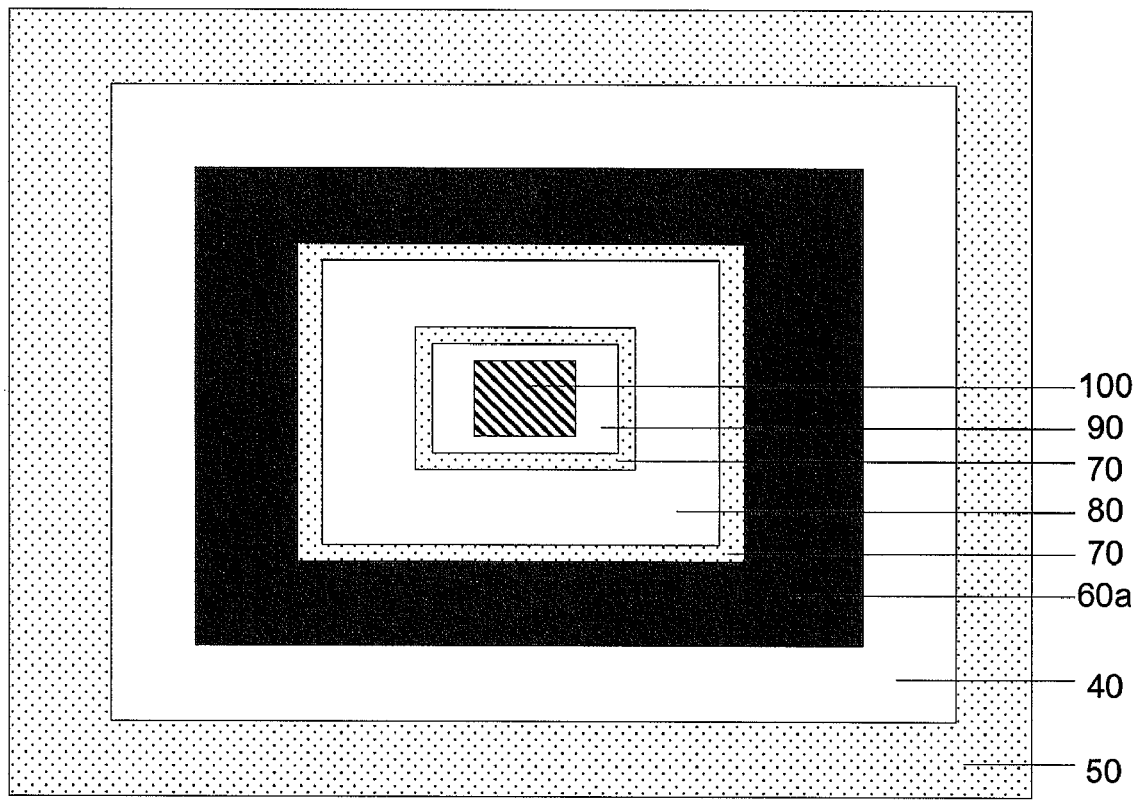

Referring to FIG. 2, the same device as shown in FIG. 1 is shown, but from the perspective of the top of the device. In FIG. 2, certain elements (such as, for example, the DT 40, the P+ guard ring 90, and the doped region 100) are depicted, even though in the final structure as shown in FIG. 1, these elements would be covered by other elements (such as, for example, the first STI 50 and the salicide 110).

Figure 3:
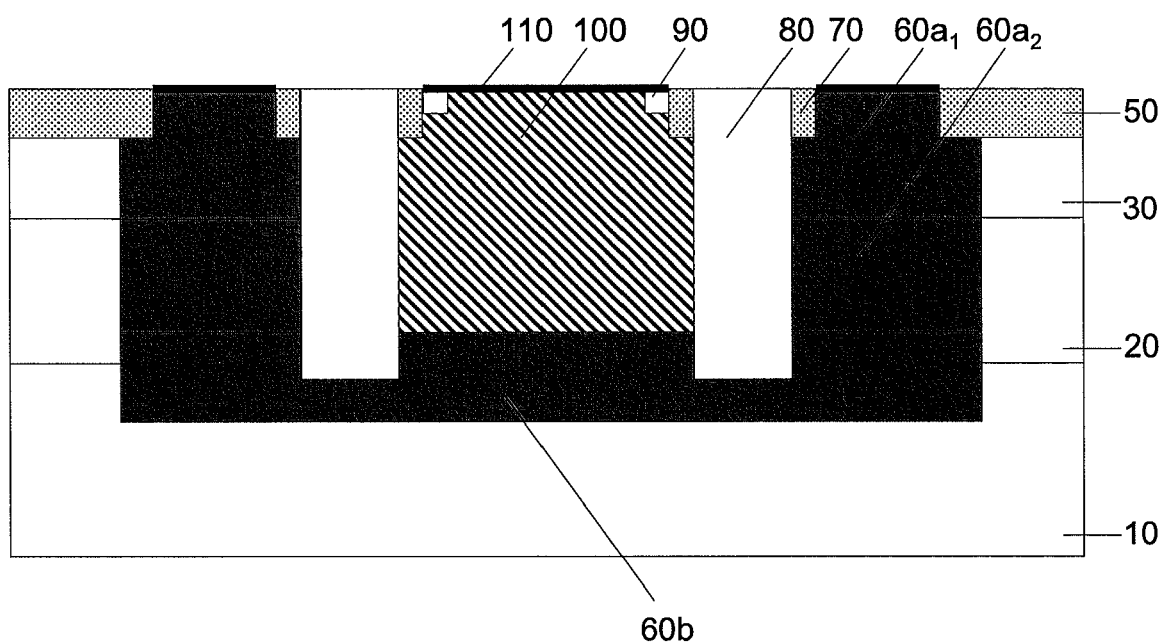

Referring to FIG. 3, a device similar to that shown in FIG. 1 is shown in cross-section according to another embodiment of the invention. The structure shown in FIG. 2 differs from that of FIG. 1 in that the structure shown in FIG. 2 does not employ a deep trench. As compared to the structure shown in FIG. 1, this structure will have increased capacitance on the side wall, but will be less expensive to produce. Nonetheless, this structure will have improved noise isolation as compared with the prior art. The structure shown in FIG. 3 may be produced by the method described above, but omitting the step of forming the deep trench.

As discussed above with reference to FIG. 1, in the device shown in FIG. 3, a low-resistance and low-capacitance path connects the sub-collector 60*b* and the reach-through structure 60*a*. This path is isolated from the inside by the TI 80. Additionally, by the dual-epitaxial method described herein, the DS 60*b* is distanced substantially further from the surface of the structure.

Figure 4:
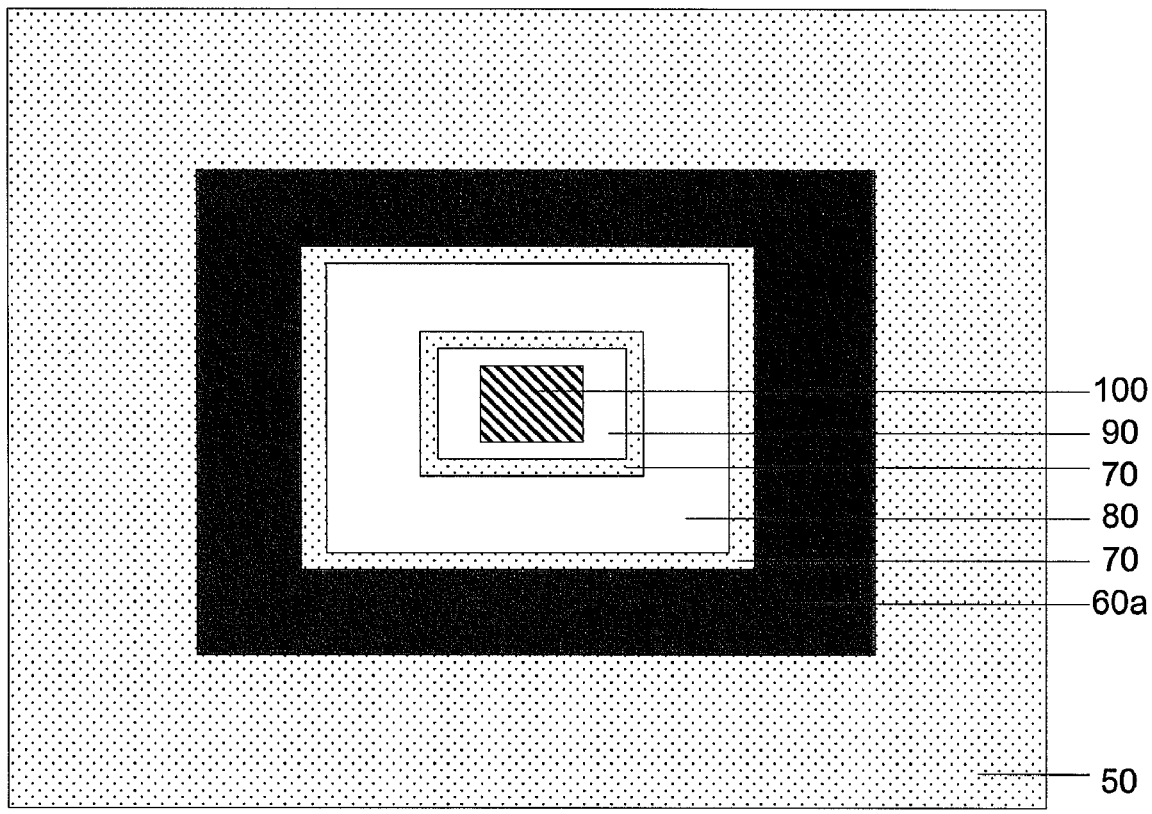

Referring to FIG. 4, the same device as shown in FIG. 3 is shown, but from the perspective of the top of the device. In FIG. 4, certain elements (such as, for example, the P+ guard ring 90, and the doped region 100) are depicted, even though in the final structure as shown in FIG. 3, these elements would be covered by other elements (such as, for example, the salicide 110). It is known in the art, that with the absence of the deep trench, parasitic capacitances may be reduced by increasing the distance to adjacent doped regions, thus creating a high resistance region around the outside perimeter of the reach-through region 60*a*.

Figure 5:
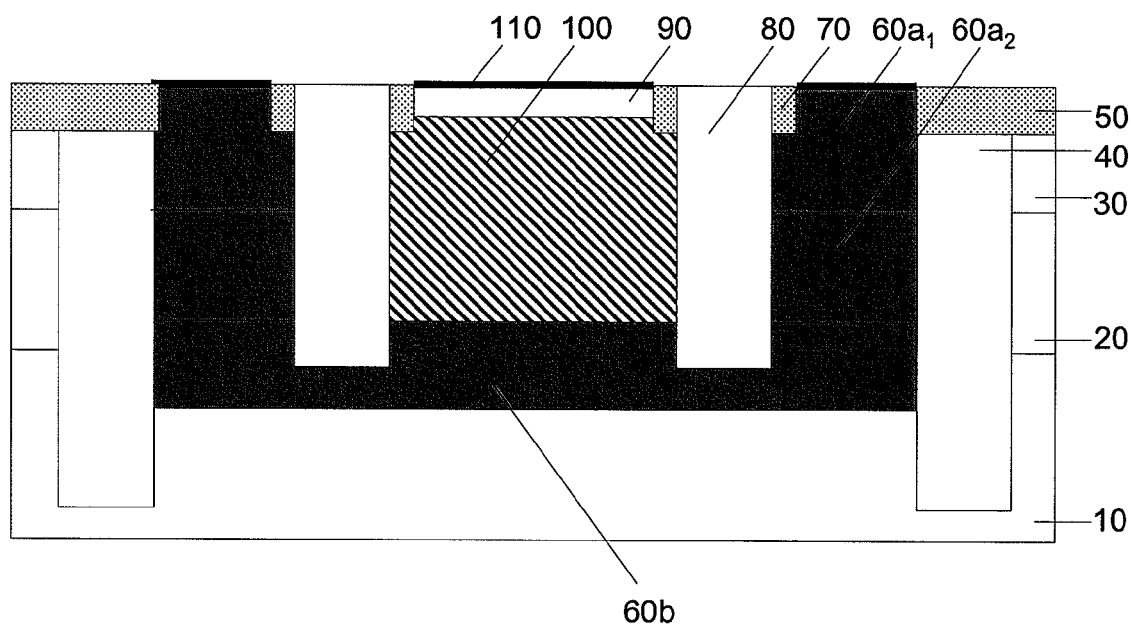

Referring to FIG. 5, a double-epitaxy multi-trench isolation PIN diode device is shown according to another embodiment of the invention. The structure shown in FIG. 5 differs from that shown in FIG. 1. In the structure shown in FIG. 5, the P+ diffusion region 90 extends completely between the second STI 70 (that is, is not a guard ring as in previous embodiments). Additionally, the doped region 100 comprises a nearly intrinsic region (whereas in previous embodiments, this region comprised a low-doped N region). In this embodiment, TI 80 prevents diffusion into the intrinsic region 105 from the stacked reach-through structure, creating a vertical electric field. Additionally, the increased depth of the DS from the surface of the device, in combination with the DT and TI, produces a better defined intrinsic region, improves the insertion loss, establishes a high electric field, and reduces the parasitics. The structure shown in FIG. 5 may be produced by the method described above with respect to FIG. 1, but replacing the step of forming the Schottky barrier diode with the step of forming a PIN diode.

As discussed above with reference to FIG. 1, in the device shown in FIG. 5, a low-resistance and low-capacitance path connects the sub-collector 60*b* and the reach-through structure 60*a*. This path is isolated from the outside by the DT 40, and from the inside by the TI 80. Additionally, by the dual-epitaxial method described herein, the DS 60*b* is distanced substantially further from the surface of the structure.

Figure 6:
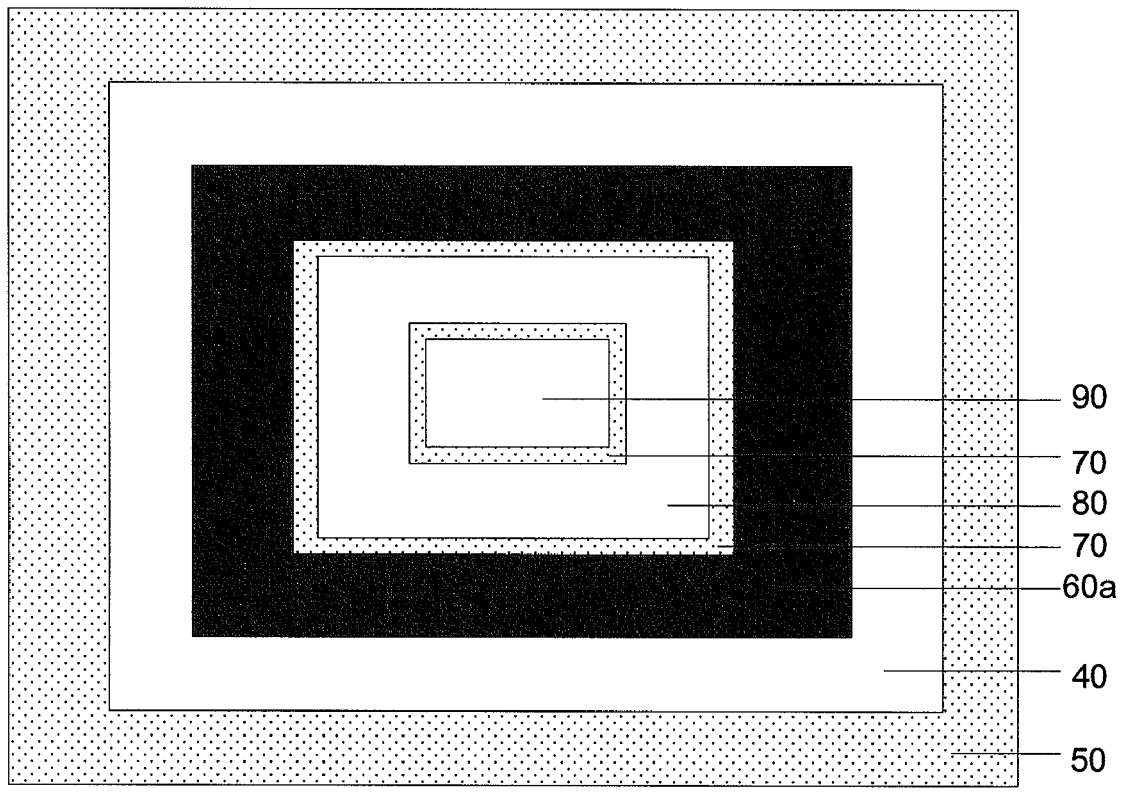

Referring to FIG. 6, the same device as shown in FIG. 5 is shown, but from the perspective of the top of the device. In FIG. 6, certain elements (such as, for example, the P+ diffusion region 90, and the intrinsic region) are depicted, even though in the final structure as shown in FIG. 5, these elements would be covered by other elements (such as, for example, the salicide 110).

Figure 7:
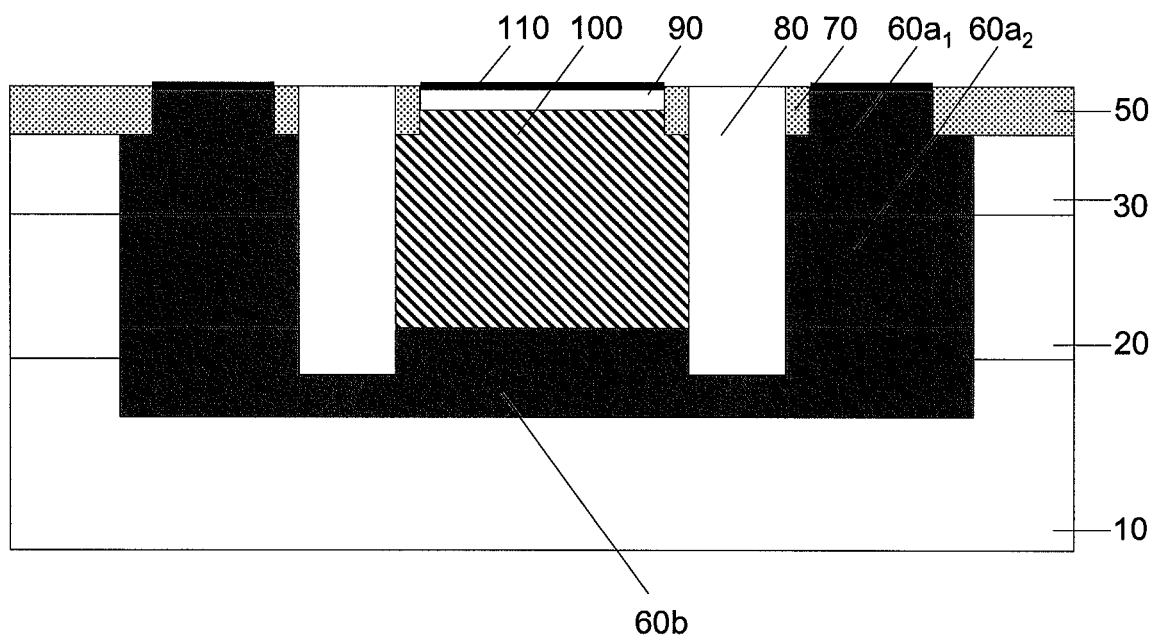

Referring to FIG. 7, a device similar to that shown in FIG. 5 is shown in cross-section according to another embodiment of the invention. The structure shown in FIG. 7 differs from that of FIG. 5 in that the structure shown in FIG. 7 does not employ a deep trench. As compared to the structure shown in FIG. 5, this structure will have increased capacitance on the side wall, but will be less expensive to produce. Nonetheless, this structure will have improved noise isolation as compared with the prior art. The structure shown in FIG. 7 may be produced by the method described above with respect to FIG. 5, but omitting the step of forming the deep trench.

As discussed above with reference to FIG. 1, in the device shown in FIG. 7, a low-resistance and low-capacitance path connects the sub-collector 60b and the reach-through structure 60a. This path is isolated from the inside by the TI 80. Additionally, by the dual-epitaxial method described herein, the DS 60b is distanced substantially further from the surface of the structure.

Figure 8:
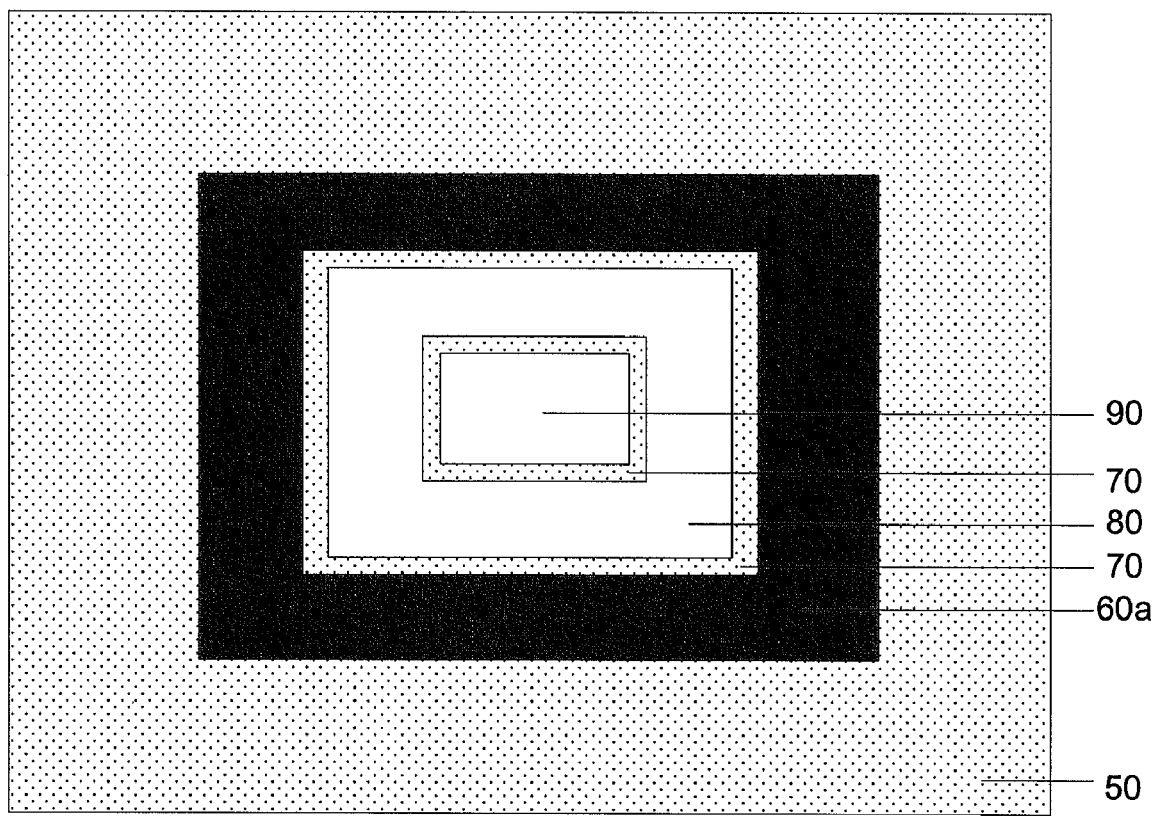

Referring to FIG. 8, the same device as shown in FIG. 7 is shown, but from the perspective of the top of the device. In FIG. 8, certain elements (such as, for example, the P+ diffusion region 90) are depicted, even though in the final structure as shown in FIG. 7, these elements would be covered by other elements (such as, for example, the salicide 110).

Figure 9:
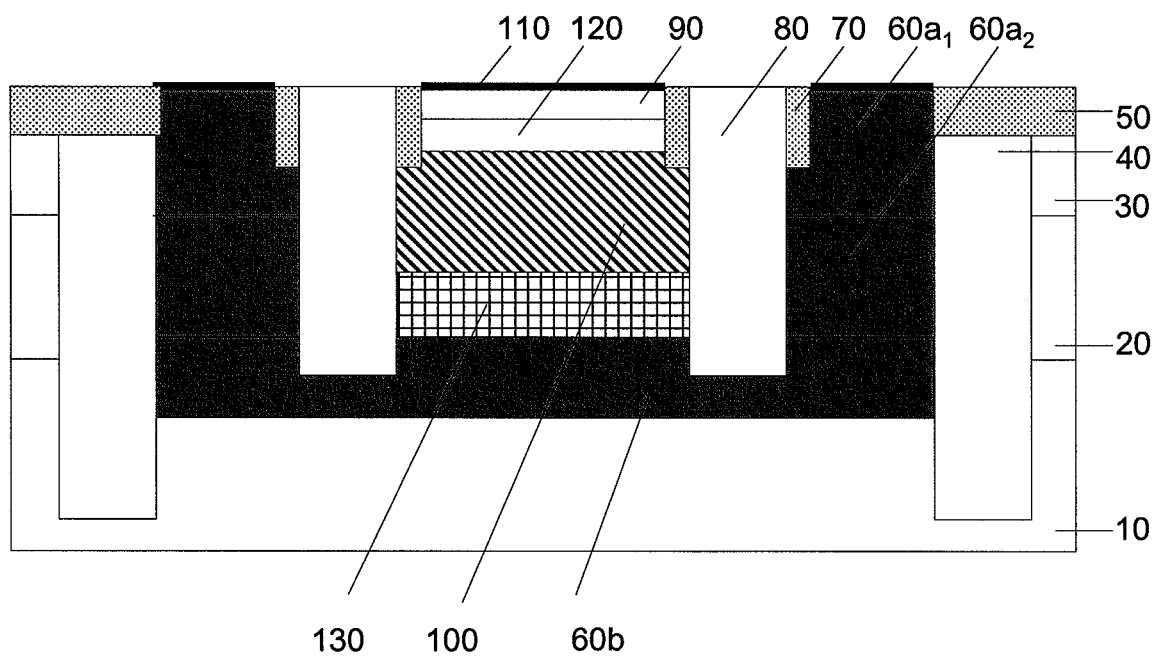

FIG. 9 shows a double-epitaxy multi-trench isolation hyper-abrupt (HA) junction varactor diode device in cross-section according to another embodiment of the invention. The structure shown in FIG. 9 differs from that shown in FIG. 5. For example, the structure shown in FIG. 9 comprises a well defined pn junction, known as an HA junction 120, under the P+ diffusion region 90. The HA junction 120 may be an implanted N-type region, such as, for example, Arsenic (As), or Antimony (Sb). The structure shown in FIG. 9 further comprises an n-type implant region 130 between the doped region 100 and the DS 60b. The n-type implant region 130 may be an N-type region. The doped region 100 is comprised of a low-doped N-type region. In this embodiment, the reach-through structure forms the cathode, and the P+ region 90 forms the anode. The structure shown in FIG. 9 may be produced by the method described above with respect to FIG. 5, but replacing the step of forming the Schottky barrier diode with the step of forming an HA varactor diode, comprising an HA junction and an n-type region.

As discussed above with reference to FIG. 1, in the device shown in FIG. 9, a low-resistance and low-capacitance path connects the sub-collector 60b and the reach-through structure 60a. This path is isolated from the outside by the DT 40, and from the inside by the TI 80. Additionally, by the dual-epitaxial method described herein, the DS 60b is distanced substantially further from the surface of the structure.

Figure 10:
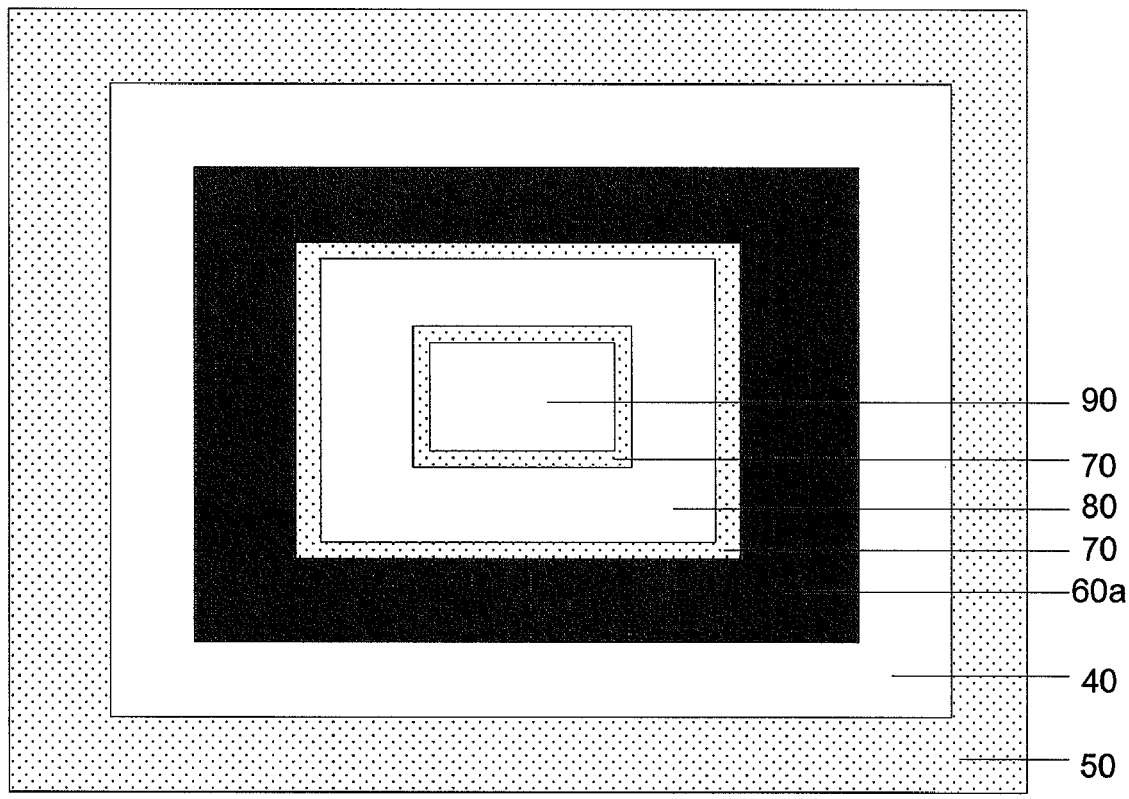

Referring to FIG. 10, the device as shown in FIG. 9 is shown, but from the perspective of the top of the device. In FIG. 10, certain elements (such as, for example, the P+ region 90 and the stacked reach-through structure) are depicted, even though in the final structure as shown in FIG. 9, these elements would be covered by other elements (such as, for example, the salicide 110).

Figure 11:
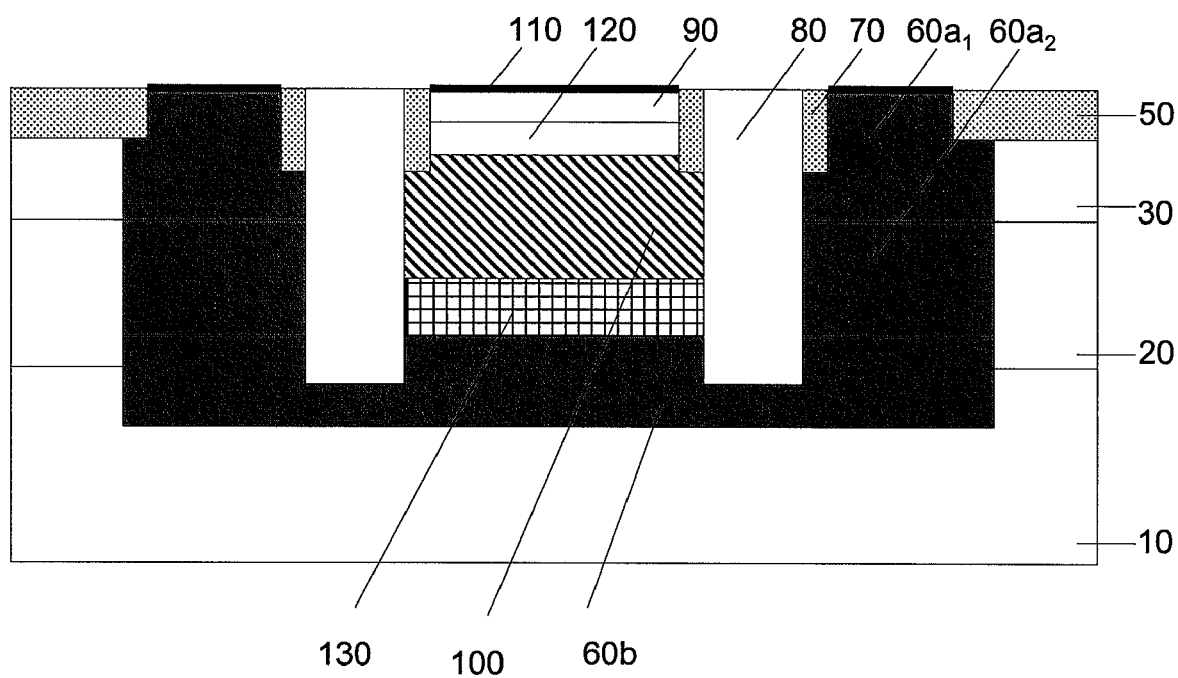

Referring to FIG. 11, a device similar to that shown in FIG. 9 is shown in cross-section according to another embodiment of the invention. The structure shown in FIG. 11 differs from that of FIG. 9 in that the structure shown in FIG. 11 does not employ a deep trench. As compared to the structure shown in FIG. 9, this structure will have increased capacitance on the side wall, but will be less expensive to produce. Nonetheless, this structure will have improved noise isolation as compared with the prior art. The structure shown in FIG. 11 may be produced by the method described above with respect to FIG. 9, but omitting the step of forming the deep trench.

As discussed above with reference to FIG. 1, in the device shown in FIG. 11, a low-resistance and low-capacitance path connects the sub-collector 60b and the reach-through structure 60a. This path is isolated from the inside by the TI 80. Additionally, by the dual-epitaxial method described herein, the DS 60b is distanced substantially further from the surface of the structure.

Figure 12:
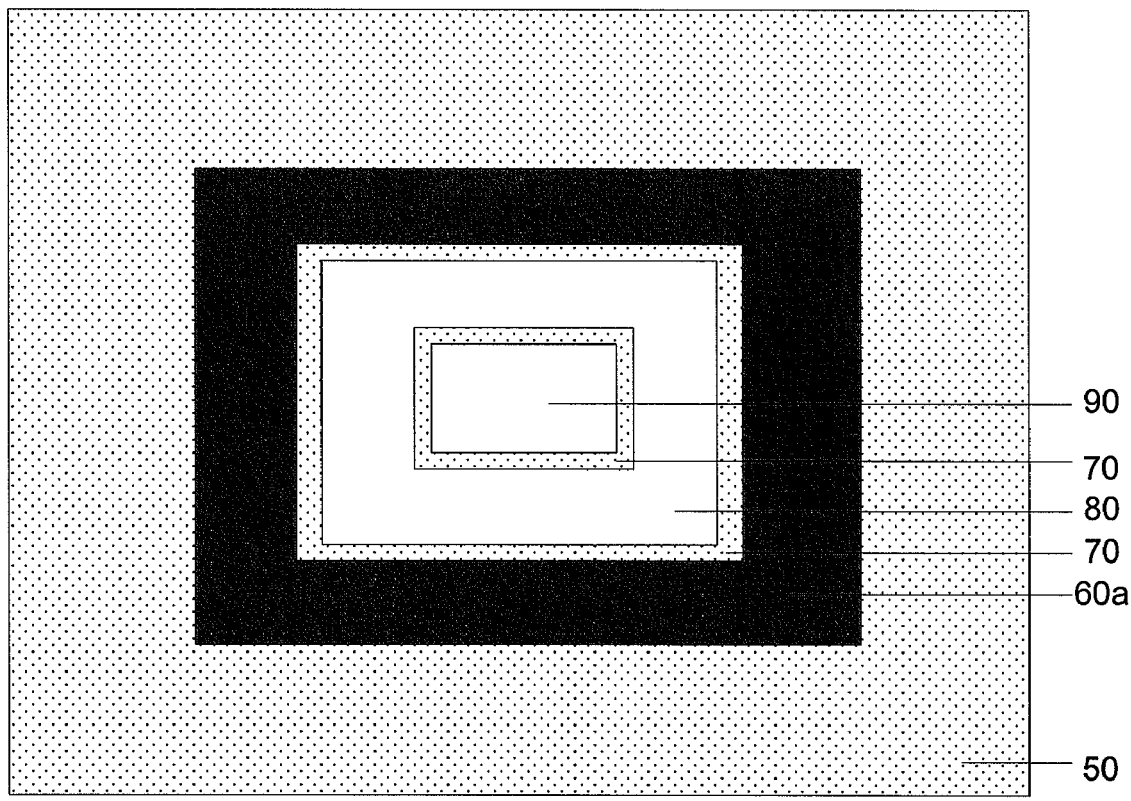

Referring to FIG. 12, the same device as shown in FIG. 11 is shown, but from the perspective of the top of the device. In FIG. 12, certain elements (such as, for example, the stacked reach-through structure and the P+ diffusion region 90) are depicted, even though in the final structure as shown in FIG. 11, these elements would be covered by other elements (such as, for example, the salicide 110).

Figure 13:
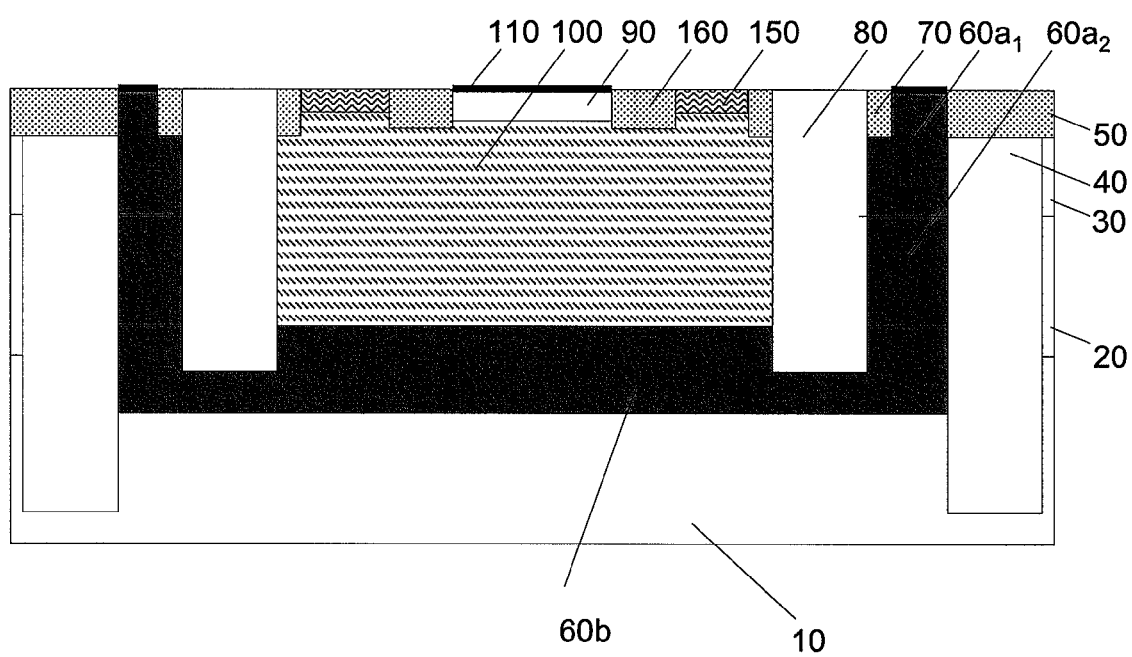

Referring to FIG. 13, a double-epitaxy multi-trench isolation electrostatic discharge (ESD) protection structure is shown in cross-section according to another embodiment of the invention. Compared to FIG. 5, the structure shown in FIG. 13 comprises an N+ diffusion region 150 and a third STI 160 located between the second STI 70 and the P+ diffusion region 90. The doped region 100 comprises a P− diffusion region.

As discussed above with reference to FIG. 1, in the device shown in FIG. 13, a low-resistance and low-capacitance path connects the sub-collector 60b and the reach-through structure 60a. This path is isolated from the outside by the DT 40, and from the inside by the TI 80. Additionally, by the dual-epitaxial method described herein, the DS 60b is distanced substantially further from the surface of the structure.

Figure 14:
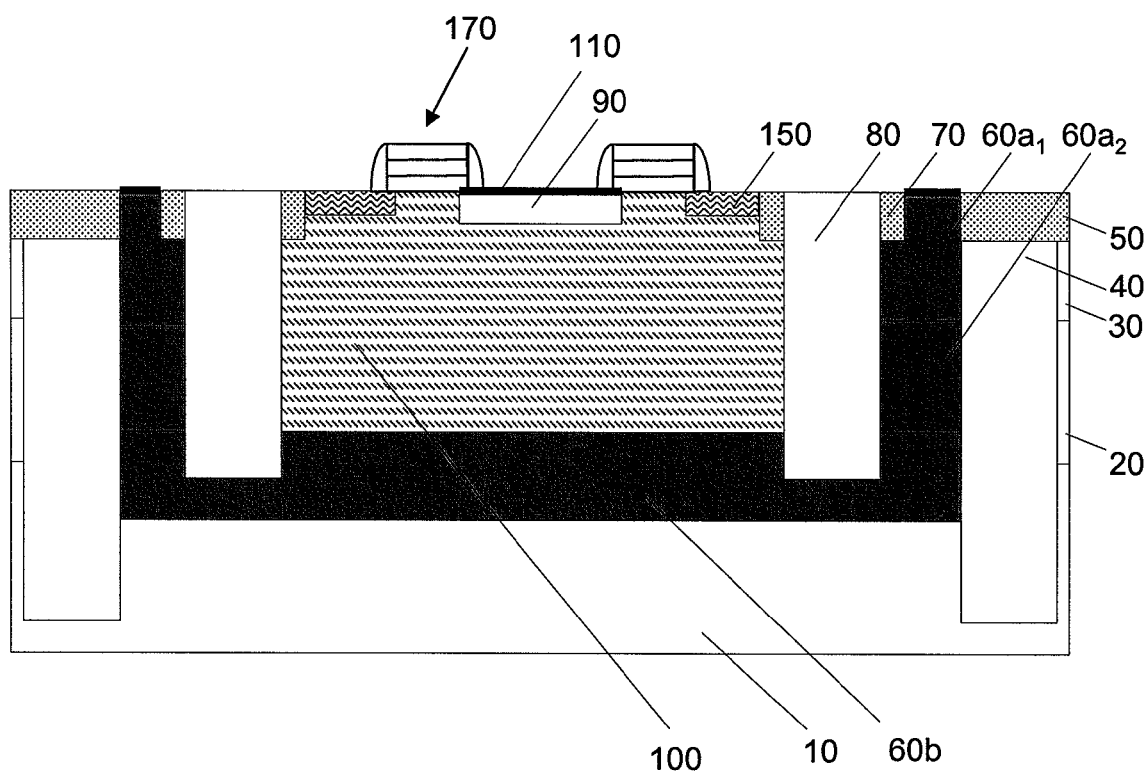

Referring to FIG. 14, a structure similar to that shown in FIG. 13 is shown. The structure shown in FIG. 14 comprises a MOSFET gate structure 170. In this embodiment, as will be understood by one of skill in the art, the polysilicon MOSFET gate structure 170 comprises a thin film dielectric (e.g., an oxide layer), a polysilicon film, and spacer(s) on the sidewall(s). Effectively, the polysilicon MOSFET gate structure 170 serves as a block mask.

As discussed above with reference to FIG. 1, in the device shown in FIG. 14, a low-resistance and low-capacitance path connects the sub-collector 60b and the reach-through structure 60a. This path is isolated from the outside by the DT 40, and from the inside by the TI 80. Additionally, by the dual-epitaxial method described herein, the DS 60b is distanced substantially further from the surface of the structure.

Figure 15:
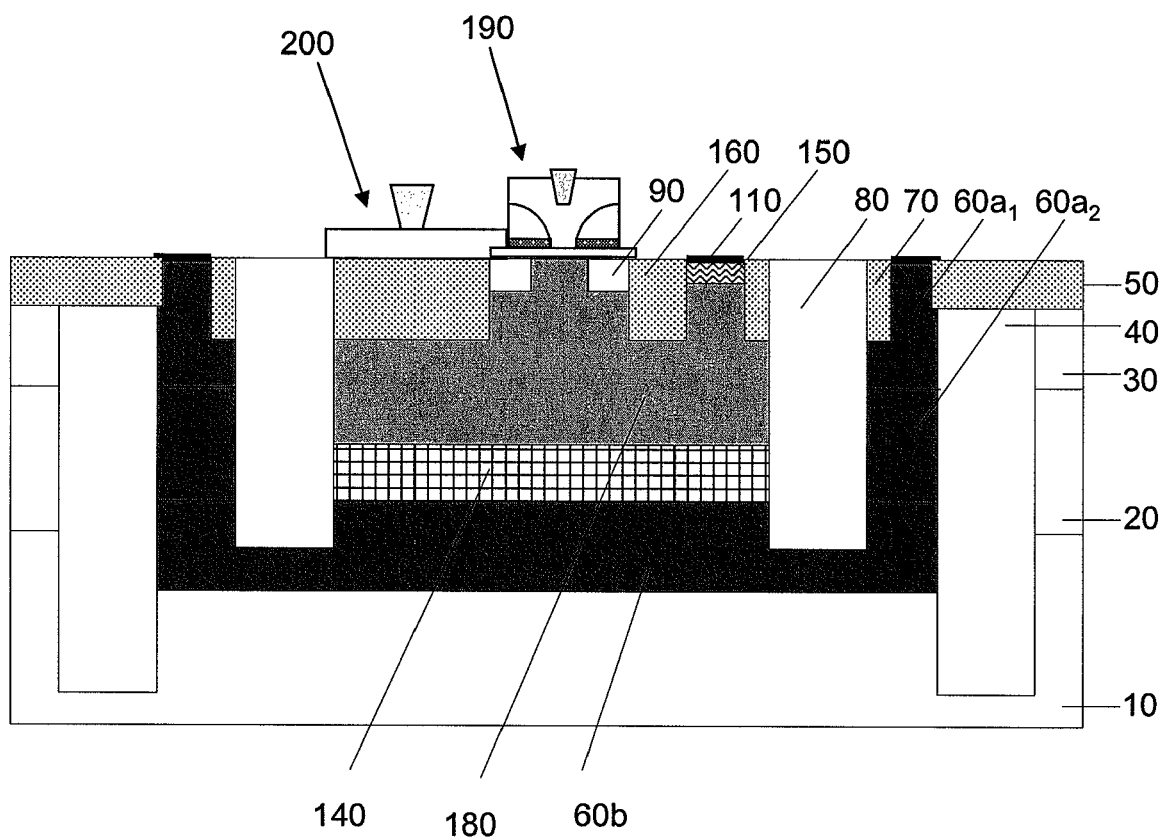

FIG. 15 shows a double-epitaxy, multi-trench, double sub-collector, Silicon Germanium (SiGe) hetero-junction bipolar transistor (HBT). In this embodiment, the device comprises a P− diffusion region 140 above the DS 60b, an N+ diffusion region 150 on the surface, a third STI 160, and a near sub-collector (NS) 180 above the P− diffusion region 140. An NS 180 is, for example, a collector that is located relatively closer to the top surface of the structure than the DS 60b. In embodiments, the NS 180 may have been formed through a conventional ion implantation process, using dopants such as, for example, Arsenic (As), Antimony (Sb), Phosphorous (P), or other N-doped elements. In embodiments, the doping concentration of the NS 180 is relatively high, for example, from $1\times10^{18}/cm^3$ to $1\times10^{21}/cm^3$. In embodiments, the sheet resistance of the NS 180 may range from approximately 1 to 100 ohms/square.

Additionally, the device further comprises an emitter structure 190 on the surface of the salicide 110, and a base structure 200 on the surface of the third STI 160, having a structure well known to those of skill in the art. In embodiments, as should be well known to those of skill in the art, the emitter structure includes N-type polysilicon (which forms the emitter) formed between insulators on a layer of single crystal silicon germanium. In this embodiment, the NS 180 is electrically isolated from the DS 60b by the P-diffusion region 140.

As discussed above with reference to FIG. 1, in the device shown in FIG. 15, a low-resistance and low-capacitance path connects the sub-collector 60b and the reach-through structure 60a. This path is isolated from the outside by the DT 40, and from the inside by the TI 80. Additionally, by the dual-epitaxial method described herein, the DS 60b is distanced substantially further from the surface of the structure than conventional sub-collectors, due to the second epi layer 30.

Figure 16:
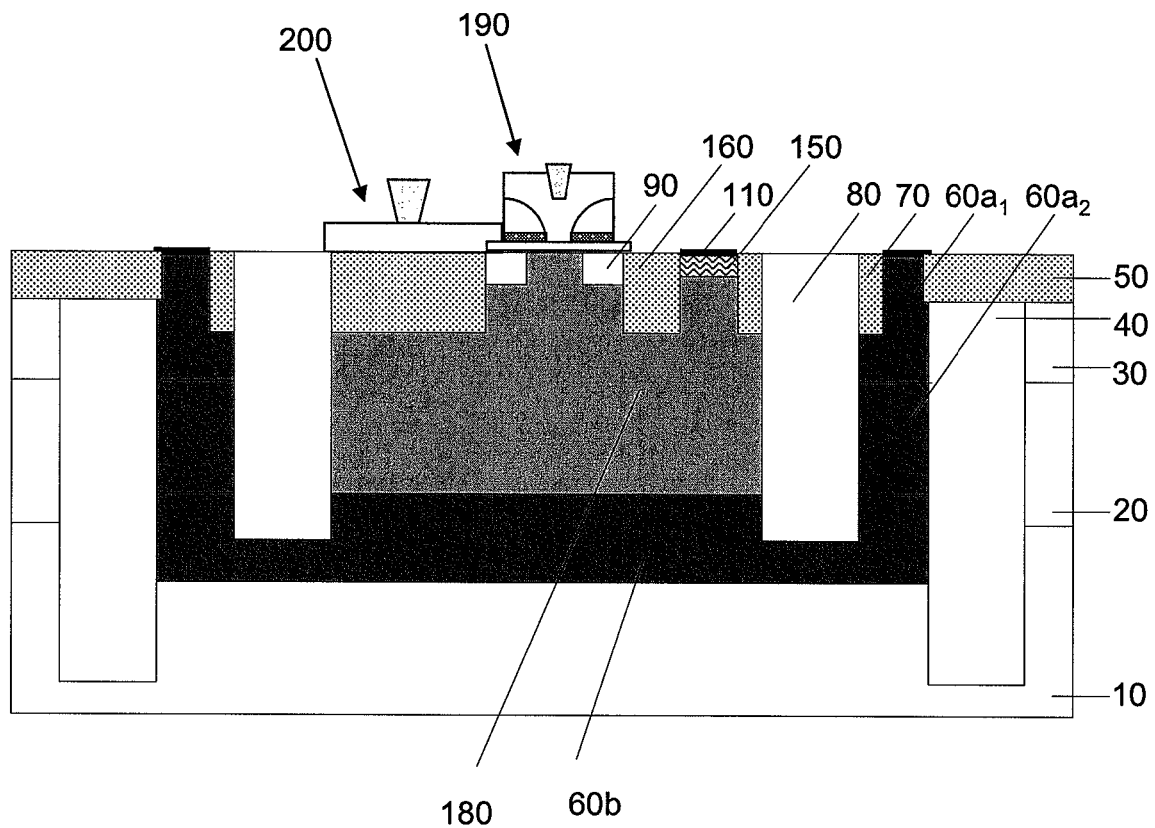

FIG. 16 shows a structure similar to that shown in FIG. 15, with the difference that the structure shown in FIG. 15 does not employ a P-diffusion region 140.

As discussed above with reference to FIG. 1, in the device shown in FIG. 16, a low-resistance and low-capacitance path connects the sub-collector 60b and the reach-through structure 60a. This path is isolated from the outside by the DT 40, and from the inside by the TI 80. Additionally, by the dual-epitaxial method described herein, the DS 60b is distanced substantially further from the surface of the structure.

Figure 17:
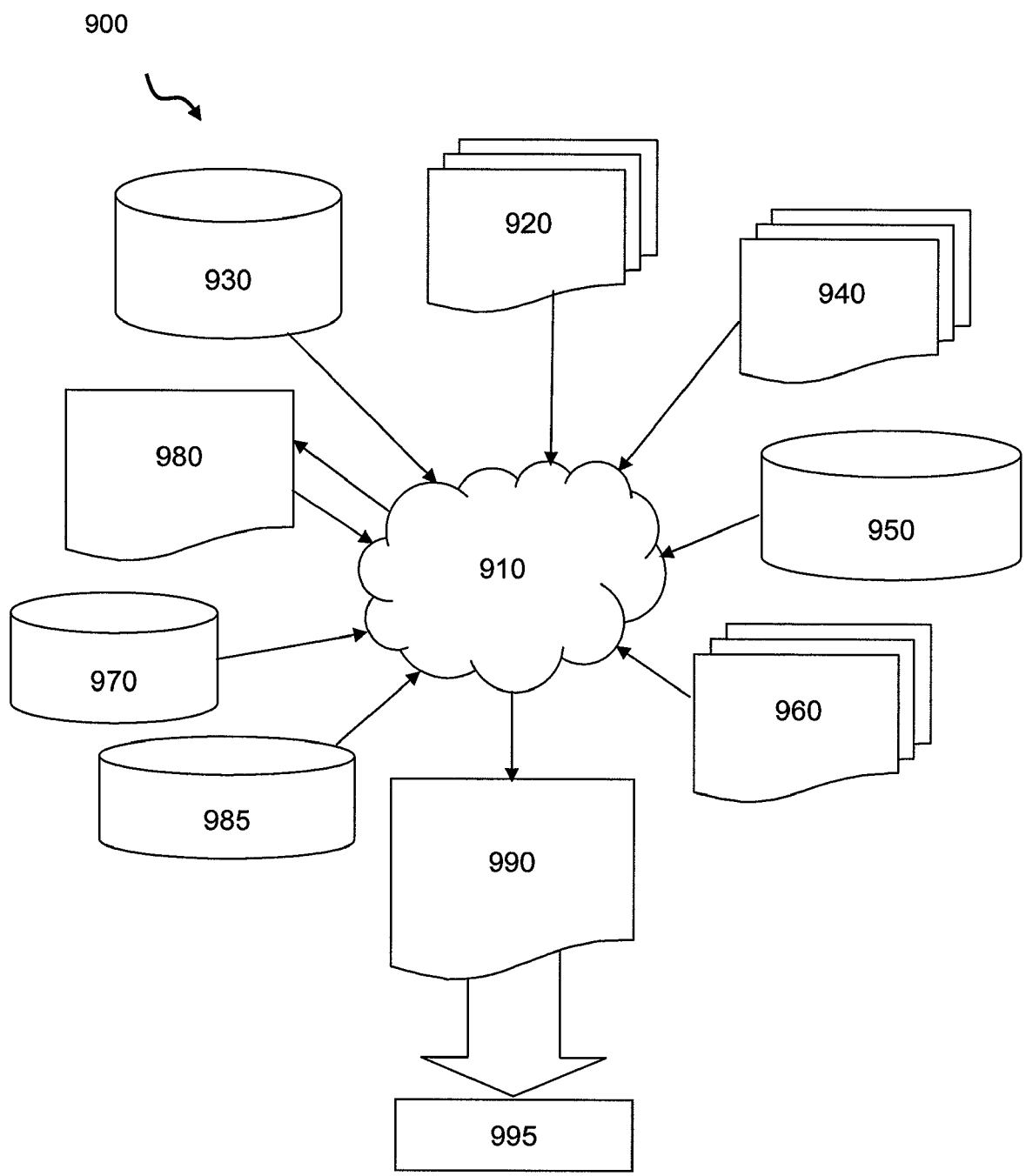
FIG. 17 is a flow diagram of a design process used in semiconductor design, manufacturing, and/or test.

FIG. 17 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises a circuit and/or structure (such as, for example, that depicted in any of FIGS. 1-16) in the form of schematics or HDL, a hardware-description language (e.g., Verilog, VHDL, C, etc.). Design structure 920 may be contained on one or more machine readable medium. For example, design structure 920 may be a text file or a graphical representation of a circuit and/or structure (such as, for example, that depicted in any of FIGS. 1-16). Design process 910 preferably synthesizes (or translates) the circuit and/or structure (such as, for example, that depicted in any of FIGS. 1-16) into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in any of FIGS. 1-16, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in any of FIGS. 1-16. Design structure 990 may then proceed to a stage 995 where, for example, design structure 990: proceeds to tape-out, is released to manufacturing, is released to a mask house, is sent to another design house, is sent back to the customer, etc.

In each of the embodiments discussed above, the trench isolation reduces the parasitics from the reach-through structure. Additionally, the deep sub-collector provides a low-resistance sub-collector.

The aforementioned devices may be implemented in numerous circuit applications. Such circuits as described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A method in a computer-aided design system, having at least one processor and a memory, for generating a functional design model of a semiconductor structure, the method comprising:
   generating, in the computer-aided design system, a functional computer-simulated representation of a deep sub-collector located in a first epitaxial layer;
   generating, in the computer-aided design system, a functional computer-simulated representation of a doped region located in a second epitaxial layer, which is above the first epitaxial layer;
   generating, in the computer-aided design system, a functional computer-simulated representation of a reach-through structure penetrating from a surface of a device through the first and second epitaxial layers to the deep sub-collector;

generating, in the computer-aided design system, a functional computer-simulated representation of a trench isolation structure penetrating from a surface of the device into the reach-through structure and surrounding the doped region; and generating, in the computer-aided design system, a functional computer-simulated representation of a salicide layer located on a surface of the device above and directly in contact with the doped region.

2. The method of claim 1, wherein the functional design model comprises a netlist, which describes the circuit.

3. The method of claim 1, wherein the functional design model resides on storage medium as a data format used for the exchange of layout data of integrated circuits.

4. The method of claim 1, wherein the functional design model includes at least one of test data files, characterization data, verification data, or design specifications.

5. The method of claim 1, further comprising:

generating, in the computer-aided design system, a functional computer-simulated representation of a shallow trench isolation structure located inside a surface of the reach-through structure, wherein the trench isolation structure penetrates through the shallow trench isolation structure to the deep sub-collector;

generating, in the computer-aided design system, a functional computer-simulated representation of a diode, wherein the diode is a Schottky barrier diode, a PIN diode, or a hyper-abrupt varactor diode, wherein the doped region is a low-doped N− or N+ region or a P+ or P− diffusion, wherein the reach-through comprises a stacked reach-through which acts as a cathode, and wherein the doped region comprises a P+ diffusion region which acts as an anode.

6. A device comprising:
a deep sub-collector located in a first epitaxial layer;
a doped region located in a second epitaxial layer, which is above the first epitaxial layer;
a reach-through structure penetrating from a surface of the device through the first and second epitaxial layers to the deep sub-collector;
a trench isolation structure penetrating from a surface of the device into the reach-through structure and surrounding the doped region; and
a diode, wherein the diode is a Schottky barrier diode, a PIN diode, or a hyper-abrupt varactor diode.

7. The device of claim 6, further comprising a deep trench isolation structure surrounding the reach-through structure and penetrating deeper into the device than the depth of the deep sub-collector.

8. The device of claim 6, wherein the doped region is a low-doped N− or N+ region.

9. The device of claim 6, wherein the doped region is a P+ or P− diffusion.

10. The device of claim 6, wherein the deep trench isolation structure laterally isolates the device.

11. The device of claim 6, wherein the reach-through comprises a stacked reach-through which acts as a cathode.

12. The device of claim 6, wherein the doped region is a P+ diffusion region which acts as an anode.

13. The structure of claim 6, further comprising a near sub-collector formed in the second epitaxial layer.

14. A method of forming a structure, comprising:
forming a first epitaxial layer on a substrate;
forming a deep sub-collector in the first epitaxial layer;
forming a second epitaxial layer on the first epitaxial layer;
forming a doped region over the deep sub-collector;
forming a reach-through in the first and second epitaxial layers which is in electrical contact with the deep sub-collector;
forming a trench isolation structure penetrating into the reach through, in physical contact with the doped region, the deep subcollector, and the reach-through, and between the doped region and the reach-through in order to electrically isolate the doped region from the reach-through.

15. The method of claim 14, further comprising forming a deep trench isolation structure on an outside of the reach-through.

16. The method of claim 14, further comprising forming the doped region in the second epitaxial layer.

17. The method of claim 14, further comprising forming a near sub-collector in the second epitaxial layer.

18. The method of claim 14, wherein a depth of the deep trench is greater than a depth of the trench isolation structure.

19. A device comprising:
a deep sub-collector located in a first epitaxial layer;
a doped region located in a second epitaxial layer, which is above the first epitaxial layer;
a reach-through structure penetrating from a surface of the device through the first and second epitaxial layers to the deep sub-collector;
a trench isolation structure penetrating from a surface of the device into the reach-through structure and surrounding the doped region;
a shallow trench isolation structure located inside a surface of the reach-through structure, wherein the trench isolation structure penetrates through the shallow trench isolation structure to the deep sub-collector; and
a salicide layer located on a surface of the device above and directly in contact with the doped region.

20. A method of forming a structure, comprising:
forming a first epitaxial layer on a substrate;
forming a deep sub-collector in the first epitaxial layer;
forming a second epitaxial layer on the first epitaxial layer;
forming a device over the deep sub-collector;
forming a reach-through in the first and second epitaxial layers which is in electrical contact with the deep sub-collector;
forming a trench isolation structure penetrating into the reach through, in contact with the device, the deep sub-collector, and the reach-through and between the device and the reach-through in order to electrically isolate the device from the reach-through;
forming a shallow trench isolation structure inside a surface of the reach-through structure, wherein the trench isolation structure penetrates through the shallow trench isolation structure to the deep sub-collector;
forming a diode, wherein the diode is a Schottky barrier diode, a PIN diode, or a hyper-abrupt varactor diode; and
forming a salicide layer on a surface of the device above and directly in contact with the doped region,
wherein the doped region is a low-doped N− or N+ region or a P+ or P− diffusion,
wherein the reach-through comprises a stacked reach-through which acts as a cathode, and
wherein the doped region comprises a P+ diffusion region which acts as an anode.

* * * * *